United States Patent
Wang et al.

(10) Patent No.: US 11,852,669 B2
(45) Date of Patent: Dec. 26, 2023

(54) ONLINE ANALYSIS SYSTEM AND METHOD FOR LINE LOSS OF TRANSMISSION LINE

(71) Applicant: State Grid Hubei Marketing Service Center (Measurement Center), Hubei (CN)

(72) Inventors: Sike Wang, Hubei (CN); Jinlin Su, Hubei (CN); Lu Chen, Hubei (CN); Dengping Tang, Hubei (CN); Dongyue Ming, Hubei (CN); Peng Yao, Hubei (CN); Yu Guo, Hubei (CN); Lieqi Yan, Hubei (CN); Ming Lei, Hubei (CN); Xin Zheng, Hubei (CN); Shangpeng Wang, Hubei (CN); Linghua Li, Hubei (CN); Bo Pang, Hubei (CN); Tian Xia, Hubei (CN); Jun Li, Hubei (CN); Xin Wang, Hubei (CN); Qi Wang, Hubei (CN); Jun Li, Hubei (CN); Fan Li, Hubei (CN); Hong Shi, Hubei (CN); Zheng Guo, Hubei (CN); Xianjin Rong, Hubei (CN); Li Liu, Hubei (CN); Li Ding, Hubei (CN); Qin Guo, Hubei (CN); Fuxiang Lv, Hubei (CN)

(73) Assignee: State Grid Hubei Marketing Service Center (Measurement Center), Wuhan (CN)

( * ) Notice: Subject to any disclaimer, the term of this patent is extended or adjusted under 35 U.S.C. 154(b) by 209 days.

(21) Appl. No.: 17/434,006

(22) PCT Filed: May 12, 2021

(86) PCT No.: PCT/CN2021/093214
§ 371 (c)(1),
(2) Date: Aug. 26, 2021

(87) PCT Pub. No.: WO2021/238652
PCT Pub. Date: Dec. 2, 2021

(65) Prior Publication Data
US 2022/0349931 A1 Nov. 3, 2022

(30) Foreign Application Priority Data
May 24, 2020 (CN) .......................... 202010445534.0

(51) Int. Cl.
*G01R 31/08* (2020.01)
*G01R 22/06* (2006.01)
*G01R 19/02* (2006.01)

(52) U.S. Cl.
CPC ........... *G01R 31/086* (2013.01); *G01R 19/02* (2013.01); *G01R 22/063* (2013.01)

(58) Field of Classification Search
CPC ..... G01R 31/086; G01R 19/02; G01R 22/063
See application file for complete search history.

(56) References Cited

FOREIGN PATENT DOCUMENTS

CN 110932403 A 3/2020

OTHER PUBLICATIONS

Zhang, Songhui, et al. "Research on On-line Monitoring Technology of Pressure Drop in Secondary Circuit of Voltage Transformer and Directional Push Technology of Alarm Information." (2018) Journal of Physics: Conference Series. vol. 1087. No. 4. IOP Publishing, 2018. (Year: 2018).*

(Continued)

*Primary Examiner* — Son T Le
*Assistant Examiner* — Brian Butler Geiss

(57) ABSTRACT

Disclosed are an online analysis system and method for a line loss of a transmission line. The system includes: a terminal extension and a terminal host, where time information synchronization between the terminal extension and the terminal host and between terminal extensions is performed by a clock synchronization module, and communi- (Continued)

cation between the terminal extension and the terminal host and between the terminal extensions is performed by a communications module; and a line loss management platform, configured to receive measurement data of the terminal extension and the terminal host, match time information in the measurement data, and if time information in the measurement data of the terminal extension and the terminal host is matched, and time information in measurement data of the terminal extensions is matched, determine corresponding line loss information based on corresponding measurement information.

5 Claims, 2 Drawing Sheets

(56) References Cited

OTHER PUBLICATIONS

H. Li, S. Zhang, D. Zhang, H. Kou and S. Zhang, "Development of PT Secondary Circuit's Drop Test Instrument Based on dsPIC30F6010 Singlechip," 2008 ISECS International Colloquium on Computing, Communication, Control, and Management, Guangzhou, China, 2008, pp. 500-504, doi: 10.1109/CCCM.2008.267. (Year: 2008).*

* cited by examiner

ONLINE ANALYSIS SYSTEM AND METHOD FOR LINE LOSS OF TRANSMISSION LINE

TECHNICAL FIELD

The present disclosure relates to the technical field of statistical analysis of losses in a grid, and specifically, to an online analysis system and method for a line loss of a transmission line.

BACKGROUND

Main losses of a high-voltage transmission line at a secondary-side watt-hour meter include a line loss of the high-voltage transmission line, an error of a potential transformer (PT), an error of a current transformer (CT), a secondary voltage drop of the PT, and an error of the watt-hour meter. At present, transmission line check is only performed on a high-voltage transmission line corresponding to the transformer, or a line between the PT and a main control room. However, time of calculating overall errors of the high-voltage transmission line corresponding to the transformer and the line between the PT and the main control room is not synchronous. As a result, calculated line loss information has low accuracy.

SUMMARY

To resolve the problem of low accuracy of line loss information obtained during check in the prior art, the present disclosure provides an online analysis system and method for a line loss of a transmission line, to provide a reliable and efficient means for statistical analysis on a loss of a line fault in a grid.

The present disclosure has the following technical solutions:

An online analysis system for a line loss of a transmission line includes: at least one terminal extension, where the terminal extension is installed on a secondary terminal box side of a PT and/or a CT in a transformer substation, and connected to a secondary-side output signal of the PT and/or the CT, each terminal extension includes a collection module for collecting the secondary-side output signals of the PT and the CT, an electric energy metering module for electric energy metering, a clock synchronization module for time synchronization, a communications module for establishing a communication connection to another terminal, a storage module for local mass storage, and a human-computer interaction interface for real-time displaying and remote control, the terminal extension is configured to measure information of the secondary terminal box side of the PT and/or the CT, and measurement data of the terminal extension includes time information and measurement information;

at least one terminal host, installed on a watt-hour meter side in a main control room, where the terminal host includes a collection module for collecting the secondary-side output signals of the PT and the CT, an electric energy metering module for electric energy metering, a clock synchronization module for time synchronization, a communications module for establishing a communication connection to another terminal, a storage module for local mass storage, and a human-computer interaction interface for real-time displaying and remote control, the terminal host is configured to measure information of the watt-hour meter side in the main control room, and measurement data of the terminal host includes time information and measurement information; where time information synchronization between the terminal extension and the terminal host and between terminal extensions is performed by the clock synchronization module, and communication between the terminal extension and the terminal host and between the terminal extensions is performed by the communications module; and a line loss management platform, configured to receive the measurement data of the terminal extension and the terminal host, match the time information in the measurement data, and if the time information in the measurement data of the terminal extension and the terminal host is matched, and time information in measurement data of the terminal extensions is matched, determine corresponding line loss information based on corresponding measurement information.

The clock synchronization module is a global positioning system (GPS), a Beidou navigation satellite system, or a local clock source.

The communications module is any one of a 2G network, a 3G network, a 4G network, a 5G network, a wireless fidelity (WiFi) network, or a wired Ethernet.

An online analysis method for a line loss of a transmission line includes the following specific steps:

collecting, by a terminal extension and a terminal host based on signals of their respective clock synchronization modules, their respective source data including a current, a voltage, a power, and a phase; after each data collection cycle; adding, by the terminal extension and the terminal host, their respective synchronization time marks, local device numbers, matching device numbers, identifiers, and other information to their respective source data, generating their respective packets according to corresponding communication protocols, and uploading their respective packets to a line loss management platform through Internet or local transmission; and monitoring, by the line loss management platform, connection ports in real time, and waiting to receive the packets;

obtaining, by the line loss management platform through monitoring, packets transmitted from different ports, and attempting to unpack them; identifying and matching, by the line loss management platform, a host or an extension based on a "matching device number", a "local device number", and a "host/extension identifier" in a packet received from each port; allocating, by the line loss management platform, one matching queue to the host and the extension separately, pushing source data into the matching queue based on a time mark, and finally searching for, starting from the middle of the matching queues of the host and the extension, data with a same time mark once in each matching cycle; and extracting, by a server, each piece of matching data, and performing operation on the matching data; and searching for, by the line loss management platform and starting from the middle of a matching queue, data with a same time mark in a packet matching process; after two pieces of data with a same time mark are successfully matched and extracted, performing, by the line loss management platform, operation on source data in packets of the two pieces of data with the same time mark; generating, by the line loss management platform after completing data calculation, a packet according to a particular communication protocol, and delivering the packet to a terminal host or a terminal extension in an ad-hoc network through respective ports of the terminal host and the terminal extension, where the packet includes original data, calculation results, and time marks of the two corresponding terminals, and a delivery cycle is the same as the matching cycle; and unpacking, by the terminal host or the terminal extension after receiving the packet, the packet to be displayed by the human-computer interaction interface, to provide reference for field personnel.

Line loss information obtained by the line loss management platform through data calculation includes a loss of a transmission line between transformer substations at which two terminal extensions are located, and errors of PTs and/or CTs connected to the terminal extensions, or a loss of a secondary voltage drop of a PT.

A method for calculating the loss of the transmission line between the transformer substations at which the two terminal extensions are located, and the errors of the PTs and/or CTs connected to the terminal extensions is as follows:

the line loss information includes a voltage ratio difference, and a process for calculating the voltage ratio difference includes:

determining a first root-mean-square (RMS) voltage based on voltage information in a packet generated by a first terminal extension;

determining a second RMS voltage based on voltage information in a packet generated by a second terminal extension;

obtaining a transformation ratio of a first PT corresponding to the first terminal extension and a transformation ratio of a second PT corresponding to the second terminal extension; and calculating the voltage ratio difference according to the following formula:

$$U' = \frac{U_a \times PT_a - U_b \times PT_b}{U_a \times PT_a} \times 100\%$$

where U' represents the voltage ratio difference, $U_a$ represents the first RMS voltage, $PT_a$ represents the transformation ratio of the first PT, $U_b$ represents the second RMS voltage, and $PT_b$ represents the transformation ratio of the second PT;

an RMS voltage is calculated according to $$U_{rms} = \sqrt{\frac{1}{T_w}\sum_{n=0}^{T_w} u_n},$$

where $U_{rms}$ represents the RMS voltage, $T_w$ represents a quantity of voltage values included in the voltage information, and $u_n$ represents an $n^{th}$ voltage value included in the voltage information; and therefore, the first RMS voltage and the second RMS voltage can be determined according to the formula;

the line loss information further includes a current ratio difference, and a process for calculating the current ratio difference includes:

determining a first RMS current based on current information in the packet generated by the first terminal extension;

determining a second RMS current based on current information in the packet generated by the second terminal extension;

obtaining a transformation ratio of a first CT corresponding to the first terminal extension and a transformation ratio of a second CT corresponding to the second terminal extension; and calculating the current ratio difference according to the following formula:

$$I' = \frac{I_a \times CT_a - I_b \times CT_b}{I_a \times CT_a} \times 100\%$$

where I' represents the current ratio difference, Ia represents the first RMS current, CTa represents the transformation ratio of the first CT, Ib represents the second RMS current, and CTb represents the transformation ratio of the second CT;

an RMS current is calculated according to $$I_{rms} = \sqrt{\frac{1}{T_w}\sum_{n=0}^{T_w} i_n},$$

where $I_{rms}$ represents the RMS current, Tw represents a quantity of current values included in the current information, and in represents an $n^{th}$ current value included in the current information; and therefore, the first RMS current and the second RMS current can be determined according to the formula;

the line loss information further includes a power ratio difference, and a process for calculating the power ratio difference includes:

using a product of the first RMS voltage and the first RMS current as a first power;

using a product of the second RMS voltage and the second RMS current as a second power;

calculating the power ratio difference according to the following formula:

$$P' = \frac{P_a \times PT_a \times CT_a - P_b \times PT_b \times CT_b}{P_a \times PT_a \times CT_a} \times 100\%$$

where P' represents the power ratio difference, Pa represents the first power, and Pb represents the second power;

the line loss information further includes a voltage angle difference, and a process for calculating the voltage angle difference includes:

determining a first voltage phase angle based on the voltage information in the packet generated by the first terminal extension;

determining a second voltage phase angle based on the voltage information in the packet generated by the second terminal extension;

calculating the voltage angle difference according to the following formula:

$$\Phi'_u = \frac{\Phi_{ua} - \Phi_{ub}}{\Phi_{ua}} \times 60$$

where $\Phi'_u$ represents the voltage angle difference, $\Phi_{ua}$ represents the first voltage phase angle, and $\Phi_{ub}$ represents the second voltage phase angle; and the line loss information further includes a current angle difference, and a process for calculating the current angle difference includes:

determining a first current phase angle based on the current information in the packet generated by the first terminal extension;

determining a second current phase angle based on the current information in the packet generated by the second terminal extension; and calculating the current angle difference according to the following formula:

$$\Phi'_I = \frac{\Phi_{Ia} - \Phi_{Ib}}{\Phi_{Ia}} \times 60$$

where $\Phi'_I$ represents the current angle difference, $\Phi_{Ia}$ represents the first current phase angle, and $\Phi_{Ib}$ represents the second current phase angle.

A method for calculating the loss of the secondary voltage drop of the PT is as follows:

loss information of the secondary voltage drop of the PT includes a plurality of types of electric parameter error values, where the loss information of the secondary voltage drop includes a voltage drop error of a secondary circuit, and a process for calculating the voltage drop error of the secondary circuit includes:

calculating, according to the following formula, the voltage drop error monitored online for the secondary circuit of the PT:

$$\Delta U = \frac{U}{100}\sqrt{f^2 + (0.0291\delta)^2} \times 100\%$$

where f represents a voltage ratio difference, and δ represents a voltage angle difference; and the loss information of the secondary voltage drop further includes an electric energy metering error caused by the secondary voltage drop, and a process for calculating the electric energy metering error includes:

calculating, according to the following formula, the electric energy metering error caused by the secondary voltage drop of the PT:

$$\varepsilon_r = \frac{f_{ab} + f_{cb}}{2} + \frac{\delta_{cb} - \delta_{ab}}{119.087} + \left(\frac{f_{cb} - f_{ab}}{3.464} - \frac{\delta_{ab} + \delta_{cb}}{68.755}\right)\tan\varphi(\%)$$

where $\varepsilon_r$ represents the electric energy metering error caused by the secondary voltage drop, f represents a voltage ratio difference, δ represents a voltage angle difference, and φ represents a load impedance angle of a high-voltage three-phase line.

Compared with the prior art, the present disclosure has the following beneficial effects: 1) Embodiments of the present disclosure provide an online analysis system for a line loss of a transmission line. In the system, a terminal host and a terminal extension can be networked freely. Based on same time information, a line loss management platform analyzes a relationship between a sum of line loss information calculated by a network between two terminal extensions and line loss information calculated by a network in which the terminal extension and the terminal host are on a same metering line, and line loss information calculated by a network in which the terminal extension and the terminal host are not on a same metering line. The line loss information is calculated based on synchronous packets, thereby improving accuracy of calculating the line loss information, and avoiding a case in which time of packets corresponding to two ends of a transmission line is not synchronized, and as a result, accuracy of line loss information calculated based on the packets is low. This provides a basis for analysis of a line loss point and an abnormal line loss, prevents and controls management and service risks, and improves marketing business control and service supervision.

2) In a packet matching process, the line loss management platform searches for, starting from the middle of a matching queue, data with a same time mark. This can effectively avoid matching failure and synchronization loss caused by a network data delay, thereby greatly improving a matching success rate. In addition, matching data is synchronized, thereby improving accuracy of line loss calculation.

DETAILED DESCRIPTION OF THE EMBODIMENTS

The technical solutions of the embodiments of the present disclosure are clearly and completely described below with reference to the accompanying drawings in the embodiments of the present disclosure. Apparently, the described embodiments are merely a part rather than all of the embodiments of the present disclosure. All other embodiments obtained by a person of ordinary skill in the art based on the embodiments of the present disclosure without creative efforts shall fall within the protection scope of the present disclosure.

The present disclosure provides an online analysis system for a line loss of a transmission line, including at least one terminal extension, at least one terminal host, and a line loss management platform.

Figure 1:
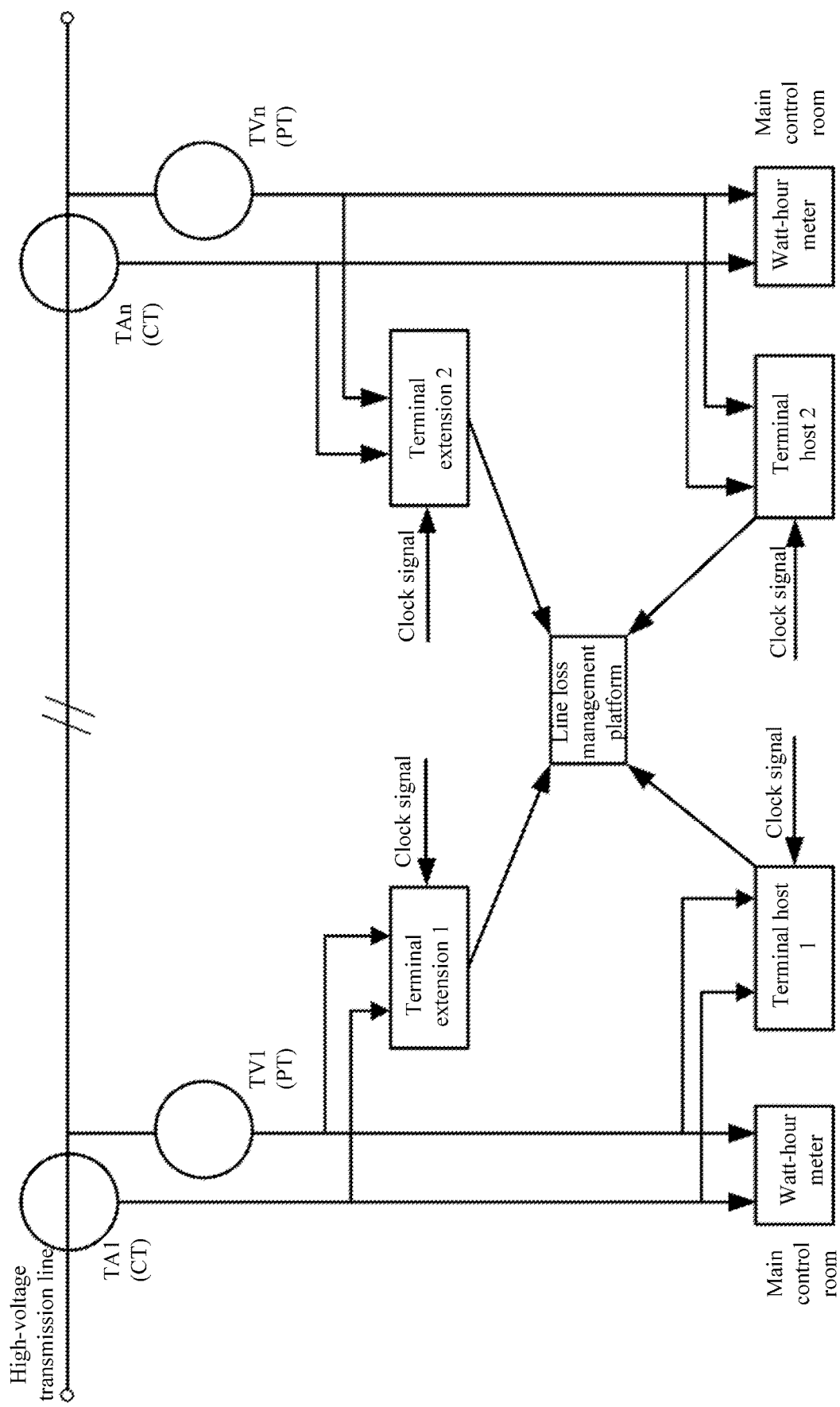
FIG. 1 is a structural diagram of an analysis system for a line loss of a transmission line.
Figure 2:
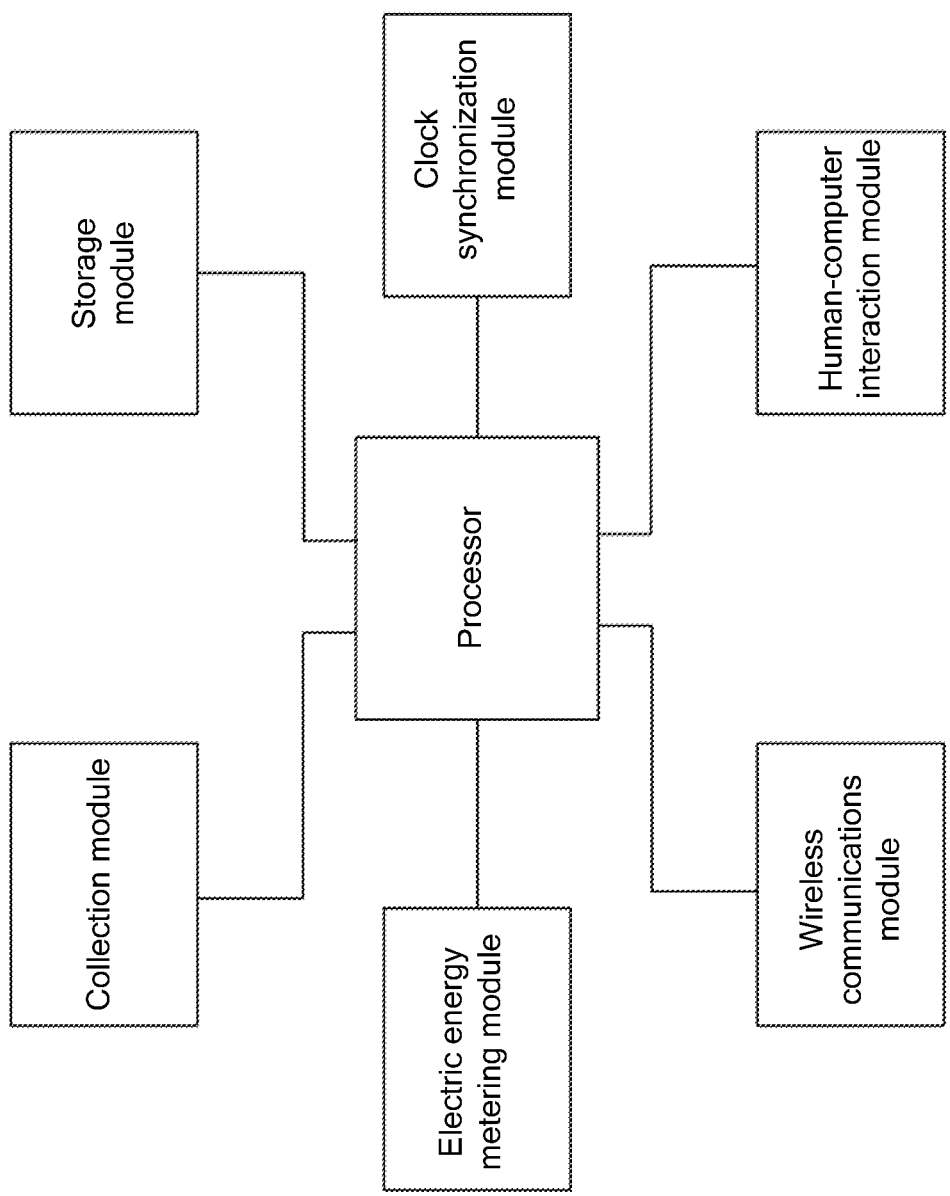
FIG. 2 is a structural diagram of a terminal host for line loss testing.

As shown in FIG. 2, the terminal extension is installed on a secondary terminal box side of a PT and/or a CT in a transformer substation, and connected to a secondary-side output signal of the PT and/or the CT. Each terminal extension includes a collection module for collecting the secondary-side output signals of the PT and the CT, an electric energy metering module for electric energy metering, a clock synchronization module for time synchronization, a communications module for establishing a communication connection to another terminal, a storage module for local mass storage, and a human-computer interaction interface for real-time displaying and remote control.

In another preferred embodiment, the terminal extension provided in the foregoing embodiment includes a processor. The processor is configured to execute the following program modules stored in a memory: a collection module for collecting the secondary-side output signals of the PT and the CT, an electric energy metering module for electric energy metering, a clock synchronization module for time synchronization, and a communications module for establishing a communication connection to another terminal.

The at least one terminal host is installed on a watt-hour meter side in a main control room, and has a same structure as the terminal extension. The terminal host is configured to measure information of the watt-hour meter side in the main control room, and measurement data includes time information and measurement information.

The terminal extension is configured to measure information of the secondary terminal box side of the PT and/or the CT, and measurement data includes time information and measurement information. Time information synchronization between terminal extensions and/or between the terminal extension and the terminal host is performed by the clock synchronization module. The clock synchronization module may be a GPS, a Beidou navigation satellite system, or a local clock source.

Communication between the terminal extensions and/or between the terminal extension and the terminal host is performed by the communications module. The communications module may be any one of a 2G network, a 3G network, a 4G network, a 5G network, a WiFi network, or a wired Ethernet, or may perform storage periodically by the storage module, and then transmit data information periodically.

The line loss management platform receives the measurement data of the terminal extension and the terminal host, matches the time information in the measurement data, and if the time information in the measurement data of the terminal extension and the terminal host is matched, and/or time information in measurement data of the terminal extensions is matched, determines corresponding line loss information based on corresponding measurement information.

The terminal host and the terminal extension and/or the terminal extensions can be networked freely. In Embodiment 1, two terminal extensions are networked, and calculated line loss information includes a loss of a transmission line between transformer substations at which the two terminal extensions are located, and errors of PTs and/or CTs connected to the terminal extensions. In Embodiment 2, a terminal extension and a terminal host are on a same metering line, the terminal extension and the terminal host are networked, and calculated line loss information is a loss of a secondary voltage drop of a PT. In Embodiment 3, a terminal extension and a terminal host are not on a same metering line, the terminal extension and the terminal host are networked, and calculated line loss information includes a loss of a transmission line between transformer substations at which two extensions are located, errors of two transformers connected on the line, and a loss of a secondary voltage drop of a PT on a terminal host side. Then, a sum of calculation results in Embodiment 1 and Embodiment 2 is compared with a calculation result in Embodiment 3 based on same time. The line loss information is calculated based on synchronous packets, thereby improving accuracy of calculating the line loss information, and avoiding a case in which time of packets corresponding to two ends of a transmission line is not synchronized, and as a result, accuracy of line loss information calculated based on the packets is low. This provides a basis for analysis of a line loss point and an abnormal line loss, prevents and controls management and service risks, and improves marketing business control and service supervision.

The present disclosure provides an online analysis method for a line loss of a transmission line. A terminal extension and a terminal host collect, based on signals of their respective clock synchronization modules, their respective source data including a current, a voltage, a power, and a phase. After each data collection cycle, the terminal extension and the terminal host add their respective synchronization time marks, local device numbers, matching device numbers, identifiers, and other information to their respective source data, generate their respective packets according to corresponding communication protocols, and upload their respective packets to a line loss management platform through Internet or local transmission. The line loss management platform monitors connection ports in real time, and waits to receive the packets.

The line loss management platform obtains, through monitoring, packets transmitted from different ports, and attempts to unpack them. The line loss management platform identifies and matches a host or an extension based on a "matching device number", a "local device number", and a "host/extension identifier" in a packet received from each port. In addition, the line loss management platform allocates one matching queue to the host and the extension separately, pushes source data into the matching queue based on a time mark, and finally searches for, starting from the middle of the matching queues of the host and the extension, data with a same time mark once in each matching cycle. A server extracts each piece of matching data, and performs operation on the matching data.

In a packet matching process, the line loss management platform searches for, starting from the middle of a matching queue, data with a same time mark. This can effectively avoid matching failure and synchronization loss caused by a network data delay, thereby greatly improving a matching success rate. In addition, matching data is synchronized, thereby improving accuracy of line loss calculation.

After two pieces of data with a same time mark are successfully matched and extracted, the line loss management platform performs operation on source data in packets of the two pieces of data with the same time mark. The line loss management platform generates, after completing data calculation, a packet according to a particular communication protocol, and delivers the packet to a terminal host or a terminal extension in an ad-hoc network through respective ports of the terminal host and the terminal extension, where the packet includes original data, calculation results, time marks, and other information of the two corresponding terminals. A delivery cycle is the same as the matching cycle. After receiving the packet, the terminal host or the terminal extension unpacks the packet to be displayed by the human-computer interaction interface, to provide reference for field personnel. The line loss management platform determines an operation manner based on a "host/extension identifier" in a packet of a corresponding thread. The determining of the operation manner may be specifically implemented in the following three manners.

Embodiment 1

Two terminal extensions are networked. Calculated line loss information includes a loss of a transmission line between transformer substations at which the two terminal extensions are located, and errors of transformers connected to the terminal extensions. The line loss information includes various types of measurement information. When the error of the transformer is very small, a voltage ratio difference, a current ratio difference, a power ratio difference, a voltage angle difference, and a current angle difference of the line loss can be calculated as follows.

The line loss information includes the voltage ratio difference, and a process for calculating the voltage ratio difference includes:
  determining a first RMS voltage based on voltage information in a packet generated by a first terminal extension;
  determining a second RMS voltage based on voltage information in a packet generated by a second terminal extension;
  obtaining a transformation ratio of a first PT corresponding to the first terminal extension and a transformation ratio of a second PT corresponding to the second terminal extension; and calculating the voltage ratio difference according to the following formula:

$$U' = \frac{U_a \times PT_a - U_b \times PT_b}{U_a \times PT_a} \times 100\%$$

where U' represents the voltage ratio difference, Ua represents the first RMS voltage, PTa represents the transformation ratio of the first PT, Ub represents the second RMS voltage, and PTb represents the transformation ratio of the second PT.

An RMS voltage is calculated according to $$U_{rms} = \sqrt{\frac{1}{T_w}\sum_{n=0}^{T_w} u_n},$$

where $U_{rms}$ represents the RMS voltage, Tw represents a quantity of voltage values included in the voltage information, and un represents an $n^{th}$ voltage value included in the voltage information. Therefore, the first RMS voltage and the second RMS voltage can be determined according to the formula.

The line loss information further includes the current ratio difference, and a process for calculating the current ratio difference includes:

determining a first RMS current based on current information in the packet generated by the first terminal extension;

determining a second RMS current based on current information in the packet generated by the second terminal extension;

obtaining a transformation ratio of a first CT corresponding to the first terminal extension and a transformation ratio of a second CT corresponding to the second terminal extension; and calculating the current ratio difference according to the following formula:

$$I' = \frac{I_a \times CT_a - I_b \times CT_b}{I_a \times CT_a} \times 100\%$$

where I' represents the current ratio difference, Ia represents the first RMS current, CTa represents the transformation ratio of the first CT, Ib represents the second RMS current, and CTb represents the transformation ratio of the second CT.

An RMS current is calculated according to $$I_{rms} = \sqrt{\frac{1}{T_w}\sum_{n=0}^{T_w} i_n},$$

where $I_{rms}$ represents the RMS current, Tw represents a quantity of current values included in the current information, and in represents an $n^{th}$ current value included in the current information. Therefore, the first RMS current and the second RMS current can be determined according to the formula.

The line loss information further includes the power ratio difference, and a process for calculating the power ratio difference includes:

using a product of the first RMS voltage and the first RMS current as a first power;

using a product of the second RMS voltage and the second RMS current as a second power; and calculating the power ratio difference according to the following formula:

$$P' = \frac{P_a \times PT_a \times CT_a - P_b \times PT_b \times CT_b}{P_a \times PT_a \times CT_a} \times 100\%$$

where P' represents the power ratio difference, Pa represents the first power, and Pb represents the second power.

The line loss information further includes the voltage angle difference, and a process for calculating the voltage angle difference includes:

determining a first voltage phase angle based on the voltage information in the packet generated by the first terminal extension;

determining a second voltage phase angle based on the voltage information in the packet generated by the second terminal extension; and calculating the voltage angle difference according to the following formula:

$$\Phi'_u = \frac{\Phi_{ua} - \Phi_{ub}}{\Phi_{ua}} \times 60$$

where $\Phi'_u$ represents the voltage angle difference, $\Phi_{ua}$ represents the first voltage phase angle, and $\Phi_{ub}$ represents the second voltage phase angle.

The line loss information further includes the current angle difference, and a process for calculating the current angle difference includes:

determining a first current phase angle based on the current information in the packet generated by the first terminal extension;

determining a second current phase angle based on the current information in the packet generated by the second terminal extension; and calculating the current angle difference according to the following formula:

$$\Phi'_I = \frac{\Phi_{Ia} - \Phi_{Ib}}{\Phi_{Ia}} \times 60$$

where $\Phi'_I$ represents the current angle difference, $\Phi_{Ia}$ represents the first current phase angle, and $\Phi_{Ib}$ represents the second current phase angle.

Embodiment 2

A terminal extension and a terminal host are on a same metering line, and the terminal extension and the terminal host are networked. Calculated line loss information is a loss of a secondary voltage drop of a PT. Loss information of the secondary voltage drop of the PT includes a plurality of types of electric parameter error values, where the loss information of the secondary voltage drop includes a voltage drop error of a secondary circuit, and a process for calculating the voltage drop error of the secondary circuit includes:

calculating, according to the following formula, the voltage drop error monitored online for the secondary circuit of the PT:

$$\Delta U = \frac{U}{100}\sqrt{f^2 + (0.0291\delta)^2} \times 100\%$$

where f represents a voltage ratio difference, and δ represents a voltage angle difference.

The loss information of the secondary voltage drop further includes an electric energy metering error caused by the secondary voltage drop, and a process for calculating the electric energy metering error includes:

calculating, according to the following formula, the electric energy metering error caused by the secondary voltage drop of the PT:

$$\varepsilon_r = \frac{f_{ab} + f_{cb}}{2} + \frac{\delta_{cb} - \delta_{ab}}{119.087} + \left(\frac{f_{cb} - f_{ab}}{3.464} - \frac{\delta_{ab} + \delta_{cb}}{68.755}\right)\tan\varphi(\%)$$

where $\varepsilon_r$ represents the electric energy metering error caused by the secondary voltage drop, f represents a voltage ratio difference, δ represents a voltage angle difference, and φ represents a load impedance angle of a high-voltage three-phase line.

Embodiment 3

A terminal extension and a terminal host are not on a same metering line, and the terminal extension and the terminal host are networked. Calculated line loss information includes a loss of a transmission line between transformer substations at which two terminal extensions are located, errors of PTs and CTs on the transmission line, and a loss of a secondary voltage drop of a PT on a terminal host side.

Line losses of different lines in an ad-hoc network are calculated, and a sum of calculation results in Embodiment 1 and Embodiment 2 is compared with a calculation result in Embodiment 3 based on same time. The line loss information is calculated based on synchronous packets, thereby improving accuracy of calculating the line loss information, and avoiding a case in which time of packets corresponding to two ends of a transmission line is not synchronized, and as a result, accuracy of line loss information calculated based on the packets is low. This provides a basis for analysis of a line loss point and an abnormal line loss, prevents and controls management and service risks, and improves marketing business control and service supervision.

Those skilled in the art should understand that the embodiments of the present disclosure may be provided as a method, a system, or a computer program product. Therefore, the present disclosure may use a form of hardware only embodiments, software only embodiments, or embodiments with a combination of software and hardware. Moreover, the present disclosure may use a form of a computer program product that is implemented on one or more computer-usable storage media (including but not limited to a disk memory, a CD-ROM, an optical memory, and the like) that include computer-usable program code.

The present disclosure is described with reference to the flowcharts and/or block diagrams of the method, the device (system), and the computer program product according to the embodiments of the present disclosure. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of any other programmable data processing device to generate a machine, so that the instructions executed by a computer or a processor of any other programmable data processing device generate an apparatus for implementing a specific function in one or more processes in the flowcharts and/or in one or more blocks in the block diagrams.

These computer program instructions may also be stored in a computer-readable memory that can instruct the computer or any other programmable data processing device to work in a specific manner, so that the instructions stored in the computer-readable memory generate an artifact that includes an instruction apparatus. The instruction apparatus implements a specific function in one or more processes in the flowcharts and/or in one or more blocks in the block diagrams.

These computer program instructions may also be loaded onto a computer or another programmable data processing device, so that a series of operations and steps are performed on the computer or the another programmable device, thereby generating computer-implemented processing. Therefore, the instructions executed on the computer or the another programmable device provide steps for implementing a specific function in one or more processes in the flowcharts and/or in one or more blocks in the block diagrams.

It should be understood that although this specification is described in accordance with the implementations, not every implementation includes only one independent technical solution. Such a description is merely for the sake of clarity, and those skilled in the art should take this specification as a whole. The technical solutions in the embodiments can also be appropriately combined to form other implementations which are comprehensible for those skilled in the art.

What is claimed is:

1. An online analysis system for a line loss of a transmission line, comprising: at least one terminal extension, wherein the terminal extension is installed on a secondary terminal box side of a potential transformer (PT) and/or a current transformer (CT) in a transformer substation, and connected to a secondary-side output signal of the PT and/or the CT, each terminal extension comprises a collection module for collecting the secondary-side output signals of the PT and the CT, an electric energy metering module for electric energy metering, a clock synchronization module for time synchronization, a communications module for establishing a communication connection to another terminal, a storage module for local mass storage, and a human-computer interaction interface for real-time displaying and remote control, the terminal extension is configured to measure information of the secondary terminal box side of the PT and/or the CT, and measurement data of the terminal extension comprises time information and measurement information;

at least one terminal host, installed on a watt-hour meter side in a main control room, wherein the terminal host comprises a collection module for collecting the secondary-side output signals of the PT and the CT, an electric energy metering module for electric energy metering, a clock synchronization module for time synchronization, a communications module for establishing a communication connection to another terminal, a storage module for local mass storage, and a human-computer interaction interface for real-time displaying and remote control, the terminal host is configured to measure information of the watt-hour meter side in the main control room, and measurement data of the terminal host comprises time information and measurement information; wherein time information synchronization between the terminal extension and the terminal host and between terminal extensions is performed by the clock synchronization module, and communication between the terminal extension and the terminal host and between the terminal extensions is performed by the communications module; and a line loss management platform, configured to receive the measurement data of the terminal extension and the terminal host, match the time information in the measurement data, and if the time information in the measurement data of the terminal extension and the terminal host is matched, and time information in measurement data of the terminal extensions is matched, determine corresponding line loss information based on corresponding measurement information;

wherein the line loss information obtained by the line loss management platform through data calculation comprises a loss of a transmission line between transformer substations at which two terminal extensions are located, and errors of PTs and/or CTs connected to the terminal extensions, or a loss of a secondary voltage drop of a PT;

wherein a method for calculating the loss of the secondary voltage drop of the PT is as follows:

loss information of the secondary voltage drop of the PT comprises a plurality of types of electric parameter error values, wherein the loss information of the secondary voltage drop comprises a voltage drop error of a secondary circuit, and a process for calculating the voltage drop error of the secondary circuit comprises:

calculating, according to the following formula, the voltage drop error monitored online for the secondary circuit of the PT:

$$\Delta U = \frac{U}{100}\sqrt{f^2 + (0.0291\delta)^2} \times 100\%$$

wherein f represents a voltage ratio difference, and δ represents a voltage angle difference; and the loss information of the secondary voltage drop further comprises an electric energy metering error caused by the secondary voltage drop, and a process for calculating the electric energy metering error comprises:

calculating, according to the following formula, the electric energy metering error caused by the secondary voltage drop of the PT:

$$\varepsilon_r = \frac{f_{ab} + f_{cb}}{2} + \frac{\delta_{cb} - \delta_{ab}}{119.087} + \left(\frac{f_{cb} - f_{ab}}{3.464} - \frac{\delta_{ab} + \delta_{cb}}{68.755}\right)\tan\varphi(\%)$$

wherein $\varepsilon_r$ represents the electric energy metering error caused by the secondary voltage drop, f represents a voltage ratio difference, δ represents a voltage angle difference, and φ represents a load impedance angle of a high-voltage three-phase line;

wherein when two terminal extensions are networked, the line loss information comprises a loss of a transmission line between transformer substations at which the two terminal extensions are located, and errors of PTs and/or CTs connected to the terminal extensions; when the terminal extension and the terminal host are on a same metering line, and the terminal extension and the terminal host are networked, the line loss information comprises a loss of a secondary voltage drop of a PT; when the terminal extension and the terminal host are not on a same metering line, and the terminal extension and the terminal host are networked, the line loss information comprises a loss of a transmission line between transformer substations at which two extensions are located, errors of two transformers connected on the line, and a loss of a secondary voltage drop of a PT on a terminal host side; and the line loss management platform is further configured to compare the line loss information when the terminal extension and the terminal host are not on a same metering line and the terminal extension and the terminal host are networked with a sum of the line loss information when two terminal extensions are networked and the line loss information when the terminal extension and the terminal host are on a same metering line and the terminal extension and the terminal host are networked, based on a same time.

2. The online analysis system for a line loss of a transmission line according to claim 1, wherein the clock synchronization module is a global positioning system (GPS), a Beidou navigation satellite system, or a local clock source.

3. The online analysis system for a line loss of a transmission line according to claim 1, wherein the communications module is any one of a 2G network, a 3G network, a 4G network, a 5G network, a wireless fidelity (WiFi) network, or a wired Ethernet.

4. An online analysis method for a line loss of a transmission line, comprising the following specific steps:

collecting, by a terminal extension and a terminal host based on signals of their respective clock synchronization modules, their respective source data comprising a current, a voltage, a power, and a phase; after each data collection cycle; adding, by the terminal extension and the terminal host, their respective synchronization time marks, local device numbers, matching device numbers, identifiers, and other information to their respective source data, generating their respective packets according to corresponding communication protocols, and uploading their respective packets to a line loss management platform through Internet or local transmission; and monitoring, by the line loss management platform, connection ports in real time, and waiting to receive the packets;

obtaining, by the line loss management platform through monitoring, packets transmitted from different ports, and attempting to unpack them; identifying and matching, by the line loss management platform, a host or an extension based on a "matching device number", a "local device number", and a "host/extension identifier" in a packet received from each port; allocating, by the line loss management platform, one matching queue to the host and the extension separately, pushing source data into the matching queue based on a time mark, and finally searching for, starting from the middle of the matching queues of the host and the extension, data with a same time mark once in each matching cycle; and extracting, by a server, each piece of matching data, and performing operation on the matching data; and searching for, by the line loss management platform and starting from the middle of a matching queue, data with a same time mark in a packet matching process; after two pieces of data with a same time mark are successfully matched and extracted, performing, by the line loss management platform, operation on source data in packets of the two pieces of data with the same time mark; generating, by the line loss management platform after completing data calculation, a packet according to a particular communication protocol, and delivering the packet to a terminal host or a terminal extension in an ad-hoc network through respective ports of the terminal host and the terminal extension, wherein the packet comprises original data, calculation results, and time marks of the two corresponding terminals, and a delivery cycle is the same as the matching cycle; and unpacking, by the terminal host or the terminal extension after receiving the packet, the packet to be displayed by the human-computer interaction interface, to provide reference for field personnel wherein line loss information obtained by the line loss management platform through data calculation comprises a loss of a transmission line between transformer substations at which two terminal extensions are located, and errors of PTs and/or CTs connected to the terminal extensions, or a loss of a secondary voltage drop of a PT;

wherein a method for calculating the loss of the secondary voltage drop of the PT is as follows:

loss information of the secondary voltage drop of the PT comprises a plurality of types of electric parameter error values, wherein the loss information of the secondary voltage drop comprises a voltage drop error of a secondary circuit, and a process for calculating the voltage drop error of the secondary circuit comprises:

calculating, according to the following formula, the voltage drop error monitored online for the secondary circuit of the PT:

$$\Delta U = \frac{U}{100}\sqrt{f^2 + (0.0291\delta)^2} \times 100\%$$

wherein f represents a voltage ratio difference, and $\delta$ represents a voltage angle difference; and the loss information of the secondary voltage drop further comprises an electric energy metering error caused by the secondary voltage drop, and a process for calculating the electric energy metering error comprises:

calculating, according to the following formula, the electric energy metering error caused by the secondary voltage drop of the PT:

$$\varepsilon_r = \frac{f_{ab} + f_{cb}}{2} + \frac{\delta_{cb} - \delta_{ab}}{119.087} + \left(\frac{f_{cb} - f_{ab}}{3.464} - \frac{\delta_{ab} + \delta_{cb}}{68.755}\right)\tan\varphi(\%)$$

wherein $\varepsilon_r$ represents the electric energy metering error caused by the secondary voltage drop, f represents a voltage ratio difference, $\delta$ represents a voltage angle difference, and $\varphi$ represents a load impedance angle of a high-voltage three-phase line;

wherein when two terminal extensions are networked, the line loss information comprises a loss of a transmission line between transformer substations at which the two terminal extensions are located, and errors of PTs and/or CTs connected to the terminal extensions; when the terminal extension and the terminal host are on a same metering line, and the terminal extension and the terminal host are networked, the line loss information comprises a loss of a secondary voltage drop of a PT; when the terminal extension and the terminal host are not on a same metering line, and the terminal extension and the terminal host are networked, the line loss information comprises a loss of a transmission line between transformer substations at which two extensions are located, errors of two transformers connected on the line, and a loss of a secondary voltage drop of a PT on a terminal host side; and the line loss management platform is further configured to compare the line loss information when the terminal extension and the terminal host are not on a same metering line and the terminal extension and the terminal host are networked with a sum of the line loss information when two terminal extensions are networked and the line loss information when the terminal extension and the terminal host are on a same metering line and the terminal extension and the terminal host are networked, based on a same time.

5. The online analysis method for a line loss of a transmission line according to claim 4, wherein a method for calculating the loss of the transmission line between the transformer substations at which the two terminal extensions are located, and the errors of the PTs and/or CTs connected to the terminal extensions is as follows:

the line loss information comprises a voltage ratio difference, and a process for calculating the voltage ratio difference comprises:

determining a first root-mean-square (RMS) voltage based on voltage information in a packet generated by a first terminal extension;

determining a second RMS voltage based on voltage information in a packet generated by a second terminal extension;

obtaining a transformation ratio of a first PT corresponding to the first terminal extension and a transformation ratio of a second PT corresponding to the second terminal extension; and calculating the voltage ratio difference according to the following formula:

$$U' = \frac{U_a \times PT_a - U_b \times PT_b}{U_a \times PT_a} \times 100\%$$

wherein U' represents the voltage ratio difference, $U_a$ represents the first RMS voltage, $PT_a$ represents the transformation ratio of the first PT, $U_b$ represents the second RMS voltage, and $PT_b$ represents the transformation ratio of the second PT; and an RMS voltage is calculated according to $$U_{rms} = \sqrt{\frac{1}{T_w}\sum_{n=0}^{T_w} u_n},$$

wherein $U_{rms}$ represents the RMS voltage, $T_w$ represents a quantity of voltage values comprised in the voltage information, and $u_n$ represents an $n^{th}$ voltage value comprised in the voltage information; and the first RMS voltage and the second RMS voltage are determined according to the formula $$U_{rms} = \sqrt{\frac{1}{T_w}\sum_{n=0}^{T_w} u_n};$$

the line loss information further comprises a current ratio difference, and a process for calculating the current ratio difference comprises:
determining a first RMS current based on current information in the packet generated by the first terminal extension;
determining a second RMS current based on current information in the packet generated by the second terminal extension;
obtaining a transformation ratio of a first CT corresponding to the first terminal extension and a transformation ratio of a second CT corresponding to the second terminal extension; and
calculating the current ratio difference according to the following formula:

$$I' = \frac{I_a \times CT_a - I_b \times CT_b}{I_a \times CT_a} \times 100\%$$

wherein I' represents the current ratio difference, $I_a$ represents the first RMS current, $CT_a$ represents the transformation ratio of the first CT, $I_b$ represents the second RMS current, and $CT_b$ represents the transformation ratio of the second CT; and
an RMS current is calculated according to $$I_{rms} = \sqrt{\frac{1}{T_w}\sum_{n=0}^{T_w} i_n},$$

wherein $I_{rms}$ represents the RMS current, Tw represents a quantity of current values comprised in the current information, and in represents an $n^{th}$ current value comprised in the current information; and the first RMS current and the second RMS current are determined according to the formula $$I_{rms} = \sqrt{\frac{1}{T_w}\sum_{n=0}^{T_w} i_n};$$

the line loss information further comprises a power ratio difference, and a process for calculating the power ratio difference comprises:
using a product of the first RMS voltage and the first RMS current as a first power;
using a product of the second RMS voltage and the second RMS current as a second power;
calculating the power ratio difference according to the following formula:

$$P' = \frac{P_a \times PT_a \times CT_a - P_b \times PT_b \times CT_b}{P_a \times PT_a \times CT_a} \times 100\%$$

wherein P' represents the power ratio difference, Pa represents the first power, and Pb represents the second power;
the line loss information further comprises a voltage angle difference, and a process for calculating the voltage angle difference comprises:
determining a first voltage phase angle based on the voltage information in the packet generated by the first terminal extension;
determining a second voltage phase angle based on the voltage information in the packet generated by the second terminal extension;
calculating the voltage angle difference according to the following formula:

$$\Phi'_u = \frac{\Phi_{ua} - \Phi_{ub}}{\Phi_{ua}} \times 60$$

wherein $\Phi'_u$ represents the voltage angle difference, $\Phi_{ua}$ represents the first voltage phase angle, and $\Phi_{ub}$ represents the second voltage phase angle; and
the line loss information further comprises a current angle difference, and a process for calculating the current angle difference comprises:
determining a first current phase angle based on the current information in the packet generated by the first terminal extension;
determining a second current phase angle based on the current information in the packet generated by the second terminal extension; and
calculating the current angle difference according to the following formula:

$$\Phi'_I = \frac{\Phi_{Ia} - \Phi_{Ib}}{\Phi_{Ia}} \times 60$$

wherein $\Phi'_I$ represents the current angle difference, $\Phi_{Ia}$ represents the first current phase angle, and $\Phi_{Ib}$ represents the second current phase angle.

* * * * *